United States Patent
Ping et al.

(10) Patent No.: US 8,767,366 B2
(45) Date of Patent: Jul. 1, 2014

(54) ELECTROSTATIC DISCHARGE PROTECTION CIRCUIT FOR COMPOUND SEMICONDUCTOR DEVICES AND CIRCUITS

(75) Inventors: Andrew T. Ping, Beaverton, OR (US); Dominic J. Ogbonnah, Beaverton, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/359,461

(22) Filed: Jan. 26, 2012

(65) Prior Publication Data
US 2012/0236449 A1    Sep. 20, 2012

Related U.S. Application Data

(63) Continuation of application No. 11/512,951, filed on Aug. 30, 2006, now Pat. No. 8,144,441.

(51) Int. Cl.
*H02H 3/20*    (2006.01)
*H02H 9/04*    (2006.01)

(52) U.S. Cl.
USPC ............ 361/91.1; 361/56; 361/91.2; 361/91.5

(58) Field of Classification Search
USPC ..................... 361/56, 111, 91.1, 91.2, 91.5
See application file for complete search history.

(56) References Cited

U.S. PATENT DOCUMENTS

| | | | |
|---|---|---|---|
| 4,707,216 A | 11/1987 | Morkoc | |
| 4,930,036 A | 5/1990 | Sitch | |
| 5,043,776 A | 8/1991 | Hida | |
| 5,399,230 A * | 3/1995 | Takatani et al. | 438/705 |
| 5,570,276 A | 10/1996 | Cuk | |
| 6,069,782 A | 5/2000 | Lien | |
| 6,121,641 A | 9/2000 | Ohno | |
| 6,172,383 B1 | 1/2001 | Williams | |
| 6,507,471 B2 * | 1/2003 | Colclaser et al. | 361/111 |

(Continued)

FOREIGN PATENT DOCUMENTS

| | | |
|---|---|---|
| JP | 61-051877 | 3/1986 |
| JP | 09-139521 | 5/1997 |

(Continued)

OTHER PUBLICATIONS

Horowitz, et al.; "The Art of Electronics;" Cambridge University Press, Ed. 2, pp. 118-119, 1989.

(Continued)

*Primary Examiner* — Rexford Barnie
*Assistant Examiner* — Zeev V Kitov
(74) *Attorney, Agent, or Firm* — Schwabe, Willamson & Wyatt, P.C.

(57) ABSTRACT

An apparatus and method is disclosed for providing an electrostatic discharge protection circuit for compound semiconductor devices and circuits. The electrostatic discharge protection circuit comprises a first terminal and a second terminal. The electrostatic discharge protection circuit further comprises a transistor shunt element that is operably coupled between the first terminal and the second terminal; the transistor shunt element is capable of providing a bi-directional discharge path between the first terminal and the second terminal. The electrostatic discharge protection circuit further comprises a shut-off element that is operably coupled with the second terminal; the shut-off element is capable of keeping the transistor shunt element turned-off.

24 Claims, 5 Drawing Sheets

(56) References Cited

U.S. PATENT DOCUMENTS

| | | |
|---|---|---|
| 6,600,356 B1* | 7/2003 | Weiss .............................. 327/310 |
| 6,646,840 B1 | 11/2003 | Sugerman |
| 6,728,086 B2 | 4/2004 | Hung |
| 7,064,942 B2* | 6/2006 | Ker et al. ........................ 361/111 |
| 7,236,053 B2* | 6/2007 | Pribble et al. ................. 330/251 |
| 7,319,311 B2 | 1/2008 | Nishida |
| 7,408,752 B2 | 8/2008 | Ma |
| 7,495,265 B2* | 2/2009 | Morishita ....................... 257/173 |
| 7,679,870 B2* | 3/2010 | Lin et al. .......................... 361/56 |
| 2003/0043517 A1 | 3/2003 | Tsuji |
| 2004/0057172 A1 | 3/2004 | Sun |
| 2005/0057866 A1 | 3/2005 | Mergens |
| 2010/0019279 A1* | 1/2010 | Chen et al. ..................... 257/194 |
| 2012/0049241 A1* | 3/2012 | Vashchenko .................. 257/146 |

FOREIGN PATENT DOCUMENTS

| | | |
|---|---|---|
| JP | 2001-358297 | 12/2001 |
| JP | 2002-261241 | 9/2002 |
| JP | 2003-068870 | 3/2003 |
| JP | 2004-521477 | 7/2004 |
| JP | 2006-114618 A | 4/2006 |

OTHER PUBLICATIONS

Written Opinion and International Search Report in International Patent Application No. PCT/US2007/076724 dated Feb. 28, 2008.

\* cited by examiner

ELECTROSTATIC DISCHARGE PROTECTION CIRCUIT FOR COMPOUND SEMICONDUCTOR DEVICES AND CIRCUITS

RELATED APPLICATIONS

This application is a continuation of U.S. application Ser. No. 11/512,951, titled "ELECTROSTATIC DISCHARGE PROTECTION CIRCUIT FOR COMPOUND SEMICONDUCTOR DEVICES AND CIRCUITS," filed Aug. 30, 2006 and issued as U.S. Pat. No. 8,144,441 on Mar. 27, 2012, the entire specification of which is hereby incorporated by reference.

TECHNICAL FIELD OF THE INVENTION

Embodiments of the present invention relate generally to semiconductor devices and more specifically, to an electrostatic discharge protection circuit for compound semiconductor devices and circuits.

BACKGROUND OF THE INVENTION

Semiconductor devices and other integrated circuits are susceptible to damage from an electrostatic discharge (ESD) event. For example, an ESD event may occur either during the assembly and packaging of these devices and circuits, or during normal operation of these devices and circuits in an end product. An ESD event occurs when a high potential voltage and current are rapidly discharged into the device or circuit, which typically results in the destruction of devices and circuits that are not protected from ESD events.

FIG. 1 shows a schematic diagram of an ESD protection circuit according to the prior art. ESD protection circuit 100 includes an input/output pad 110, an internal circuit 120, and a multiplicity of diodes 130 and 140 coupled in series to ground. In conventional ESD protection circuits, an ESD event is typically dissipated through a series of diode elements. This can be seen in ESD protection circuit 100, where diodes 130 and 140 are used to dissipate an ESD event, thereby protecting internal circuit 120 from the ESD event.

The use of diodes in the discharge path to dissipate an ESD event is disadvantageous due to the series resistance of each diode. An ESD protection device ideally should have the lowest possible resistance in order to rapidly dissipate an ESD event. As the number of diodes in the discharge path increases, the resistance in the discharge path becomes greater. This affects the ability of the ESD protection device to dissipate an ESD event as rapidly as possible.

Another disadvantage of ESD protection circuit 100 is that it uses large diodes (i.e., diodes that have large widths) in order to effectively dissipate an ESD event. This is particularly true for diodes in compound semiconductor field effect transistor (FET) technology. Among other things, large diodes consume a relatively large amount of area in the component that contains the ESD protection circuit. Consequently, the component must be larger, which, among other things, increases the cost of the component.

FIG. 2 illustrates a plot 200 of the transmission line pulse characteristic 210 of current versus voltage for an ESD protection circuit according to the prior art. The transmission line pulse characteristic 210 reflects the presence of diodes in the discharge path of the ESD protection circuit. A large series resistance in the discharge path can be seen in transmission line pulse characteristic 210 in that the dissipation of current has an increasing effect on voltage.

U.S. Pat. No. 4,930,036 illustrates a prior art ESD protection circuit that attempts to address some of the disadvantages described above. The ESD protection circuit in the '036 patent uses a transistor and a resistor, rather than a multiplicity of diodes, in the discharge path. However, the resistor adds resistance to the discharge path. Consequently, the use of the transistor and resistor, rather than a multiplicity of diodes, is still disadvantageous for the reasons described above. In addition, the ESD protection circuit in the '036 patent requires two power supplies, including a low-level voltage supply and a high-level voltage supply. Among other things, the need for power supplies increases the complexity, and therefore the cost, of the ESD protection circuit, because additional terminals are needed to connect the power supplies to the ESD protection circuit.

U.S. Patent Application Publication No. 2004/0057172 illustrates another prior art ESD protection circuit. The ESD protection circuit in the '172 patent application is implemented using heterojunction bipolar transistor (HBT) technology. One disadvantage of such an ESD protection circuit is that it requires two separate discharge paths, one to dissipate a positive ESD event and another to dissipate a negative ESD event. Among other things, the presence of two discharge paths adds complexity to the ESD protection circuit, consumes space, and increases the cost of the ESD protection circuit. In addition, the ESD protection circuit in the '172 patent application uses at least one diode in series with a transistor in the discharge path. This increases the series resistance in the discharge path, which, as described above, is a disadvantage for ESD protection circuits.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of embodiments of the present invention. Those skilled in the art will recognize that embodiments of the present invention provide many inventive concepts and novel features that are merely illustrative, and are not to be construed as restrictive. Accordingly, the specific embodiments described herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the present invention.

Figure 1:
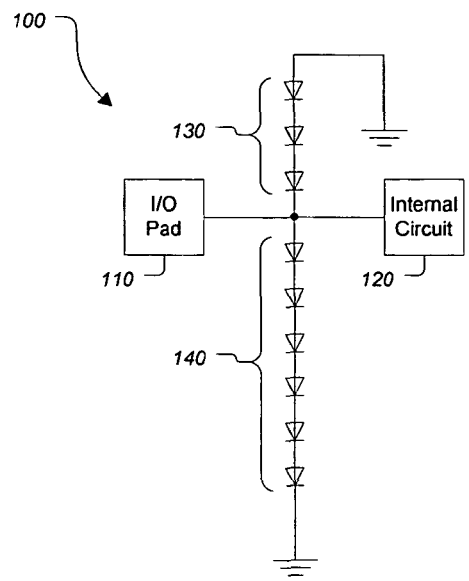
FIG. 1 illustrates a schematic diagram of an electrostatic discharge (ESD) protection circuit according to the prior art.
Figure 2:
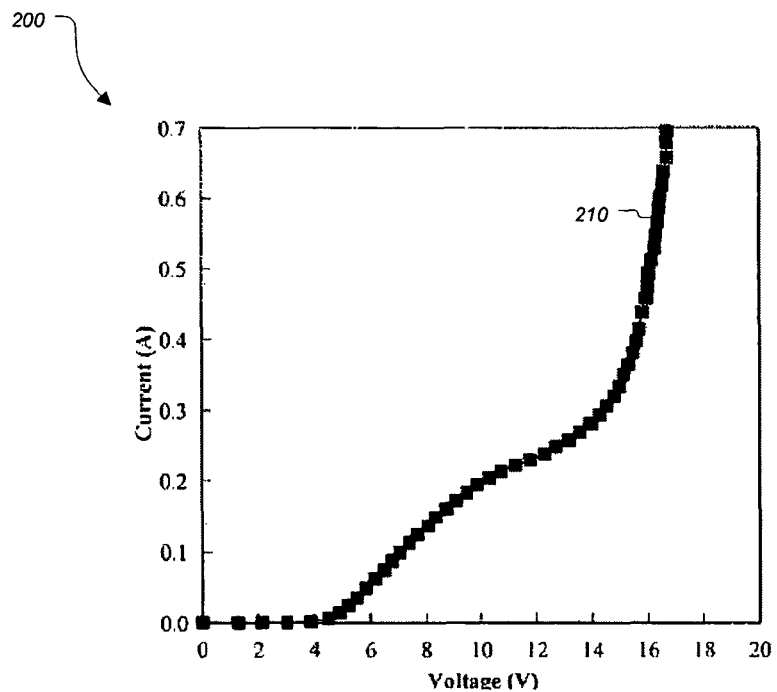
FIG. 2 illustrates a plot of the transmission line pulse characteristic of current versus voltage for an ESD protection circuit according to the prior art.
Figure 3:
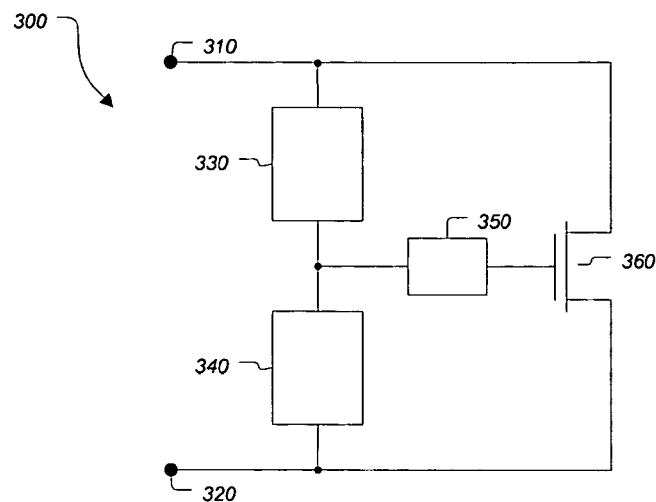
FIG. 3 illustrates a block diagram of an ESD protection circuit according to one embodiment of the present invention.

FIG. 3 illustrates a block diagram of an electrostatic discharge (ESD) protection circuit 300 according to an embodiment of the present invention. ESD protection circuit 300 comprises terminals 310 and 320, a triggering element 330, a shut-off element 340, a series element 350, and a transistor shunt element 360. Triggering element 330, shut-off element 340, series element 350 and transistor shunt element 360 provide a minimal resistance discharge path, so that an ESD event does not damage devices or integrated circuits that may be coupled with terminals 310 and 320. As described in more detail below, when an ESD event occurs across terminals 310 and 320, triggering element 330 activates transistor shunt element 360 to dissipate the ESD event.

Triggering element 330 provides the ability to set the value of a turn-on voltage of transistor shunt element 360, i.e., the voltage at which transistor shunt element 360 turns-on and is activated to dissipate an ESD event. The number of diodes in triggering element 330 can be used to establish the turn-on voltage level. Shut-off element 340 keeps the ESD discharge path turned-off during normal operation, so that it is not used until such time as the turn-on voltage of transistor shunt element 360 is reached. Series element 350 provides the ability to limit the gate current into transistor shunt element 360. Transistor shunt element 360 provides a bi-directional discharge path, through, for example, the drain and source of transistor shunt element 360, to dissipate an ESD event.

Embodiments of the present invention operate in connection with either a positive ESD event, where the potential of terminal 310 is higher than the potential of terminal 320, or a negative ESD event, where the potential of terminal 320 is higher than the potential of terminal 310. The polarity of the ESD event determines the discharge direction between terminals 310 and 320. For example, if a positive ESD event occurs, triggering element 330 is the element that turns-on transistor shunt element 360, but if a negative ESD event occurs, shut-off element 340 becomes the element that turns-on transistor shunt element 360. Thus, in accordance with the principles of embodiments of the present invention, ESD protection circuit 300 provides for a bi-directional discharge path for an ESD event across terminals 310 and 320. As is the case with a positive ESD event, series element 350 provides the ability to limit the gate current into transistor shunt element 360 during a negative ESD event.

In one embodiment of the present invention, ESD protection circuit 300 is fabricated using pseudomorphic high electron mobility transistor (pHEMT) technology, which is a compound semiconductor field effect transistor (FET) technology. However, ESD protection circuit 300 may be fabricated using other compound semiconductor FET technologies, including, for example, but not limited to, metal semiconductor field effect transistor (MESFET), junction field effect transistor (jFET), high electron mobility transistor (HEMT), metamorphic high electron mobility transistor (mHEMT), heterostructure field effect transistor (HFET), modulation-doped field effect transistor (MODFET), or any other suitable compound semiconductor FET technologies. Compound semiconductor materials used to fabricate ESD protection circuit 300 may include materials, such as, for example, Gallium Arsenide (GaAs), Indium Phosphide (InP), Gallium Nitride (GaN), and derivatives of the foregoing, such as Aluminum Gallium Arsenide (AlGaAs), Indium Gallium Arsenide (InGaAs), Indium Gallium Phosphide (InGaP), Indium Aluminum Arsenide (InAlAs), Aluminum Gallium Nitride (AlGaN), Indium Gallium Nitride (InGaN), Gallium Arsenide Antimonide (GaAsSb), Indium Gallium Arsenide Nitride (InGaAsN), and Aluminum Arsenide (AlAs), for example. In one embodiment of the present invention, ESD protection circuit 300 is formed on a Gallium Arsenide (GaAs) substrate. However, ESD protection circuit 300 may be formed on other types of substrates, such as, for example, Indium Phosphide (InP) and Gallium Nitride (GaN).

In one embodiment of the present invention, terminal 310 may be coupled with a device or an integrated circuit to be protected from an ESD event, and terminal 320 may be coupled with a ground. In another embodiment of the present invention, terminal 320 may be coupled with a reference potential other than ground. For example, the reference potential may provide an additional voltage potential to increase or decrease the level of the turn-on voltage, as will be explained below in greater detail. In addition or as an alternative, terminal 310 may be coupled with a bond pad, input/output pin or any other connection associated with ESD protection circuit 300, and terminal 320 may be coupled with another bond pad, input/output pin or any other connection within ESD protection circuit 300.

In one embodiment of the present invention, transistor shunt element 360 is an enhancement-mode pHEMT. Although transistor shunt element 360 is described as an enhancement-mode pHEMT, embodiments of the present invention contemplate any suitable enhancement-mode FET such as, for example, MESFET jFET, HEMT, mHEMT, HFET, MODFET or any other suitable compound semiconductor FET.

Embodiments of the present invention activate transistor shunt element 360 on a voltage-controlled basis, in connection with a gate-to-source voltage. That is, voltage is applied to the gate of transistor shunt element 360, and if the magnitude of the gate-to-source voltage is less than the threshold voltage of transistor shunt element 360, then transistor shunt element 360 is turned-off. Shut-off element 340 holds the gate-to-source voltage of transistor shunt element 360 below the threshold voltage of transistor shunt element 360 until the turn-on voltage established based on triggering element 330 is reached.

As described above, the turn-on voltage of ESD protection circuit 300 can be set using diodes in triggering element 330. However, unlike in the prior art, no diodes or resistors are used in the discharge path. Embodiments of the present invention use transistor shunt element 360 to discharge the ESD event. Among other things, this reduces the series resistance in the discharge path of embodiments of the present invention, which enables embodiments of the present invention to dissipate an ESD event as rapidly as possible. In addition, because diodes are not used in the discharge path since they do not dissipate an ESD event, smaller diodes may be used relative to those used in prior art ESD protection circuits that use diodes in the discharge path. Among other things, this reduces the size of ESD protection circuit 300 relative to such prior art ESD protection circuits.

In addition, embodiments of the present invention have one discharge path for both positive and negative ESD events, rather than two discharge paths like some prior art ESD protection circuits. Among other things, this reduces the complexity of embodiments of the present invention, reduces the amount of space consumed, and reduces the cost of the component that includes the ESD protection circuit of embodiments of the present invention. Moreover, unlike with some prior art ESD protection circuits, the use of a power supply is not required with embodiments of the present invention. Among other things, this reduces the complexity, and therefore the cost, of ESD protection circuits in accordance with embodiments of the present invention.

Figure 4:
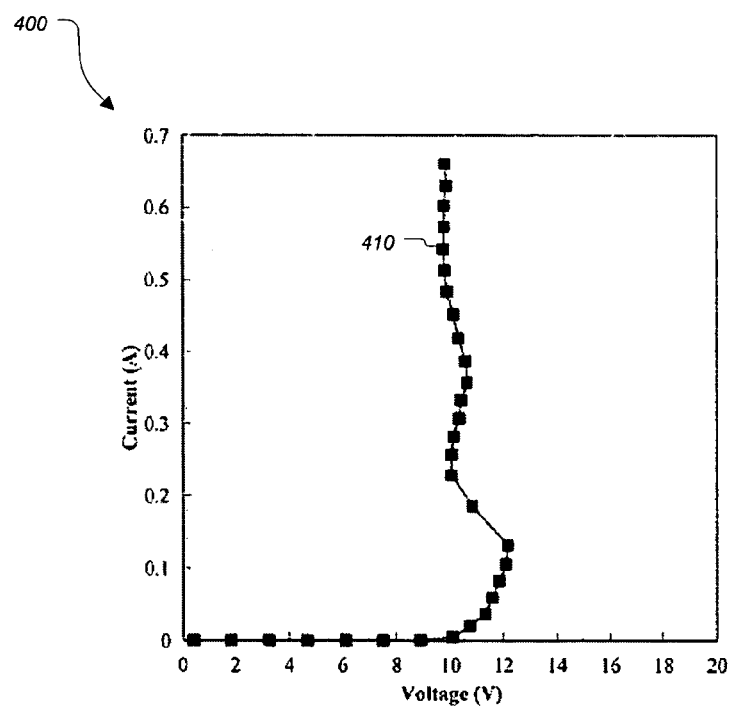
FIG. 4 illustrates a plot of the transmission line pulse characteristic of current versus voltage according to embodiments of the present invention.

FIG. 4 illustrates a plot 400 of the transmission line pulse characteristic 410 of the current versus voltage according to embodiments of the present invention. As described above, during an ESD event, ESD protection circuit 300 provides a discharge path so that the ESD event does not damage devices and/or integrated circuits. The discharge path in ESD protection circuit is a low resistance path to ground that allows for a rapid dissipation of an ESD event through transistor shunt element 360. Accordingly, it can be seen in FIG. 4 that ESD protection circuit 300 dissipates increasing current with only a minimal effect on voltage.

For the transmission line pulse characteristic 410 in FIG. 4, triggering element 330 provides a turn-on voltage of approximately 10 volts. Once the turn-on voltage has been exceeded, the transmission-line pulse characteristic 410 is shown to "snap back," in this case to a voltage of 10 volts. The "snapback" voltage is determined by the construction of the transistor shunt element 360.

FIGS. 5A through 5I illustrate the ESD protection circuit 300 of FIG. 3 according to embodiments of the present invention. As described above, ESD protection circuit 300 comprises terminals 310 and 320, triggering element 330, shut-off element 340, series element 350, and transistor shunt element 360. In addition, the drain of transistor shunt element 360 is coupled with terminal 310, the source of transistor shunt element 360 is coupled with terminal 320, and the gate of transistor shunt element 360 is coupled with series element 350.

Figure 5A:
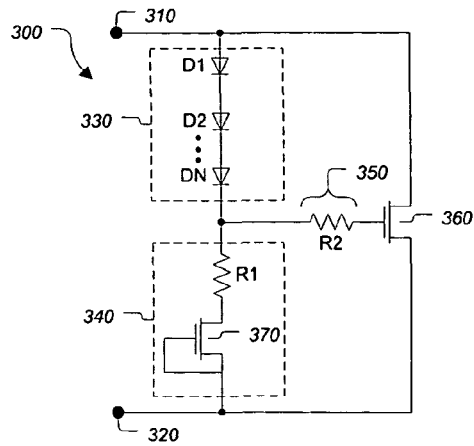
FIGS. 5A through 5I illustrate the ESD protection circuit of FIG. 3 according to embodiments of the present invention.

In FIG. 5A, triggering element 330 comprises a plurality of diodes D1, D2, through DN coupled in series from terminal 310 to shut-off element 340 and series element 350. FIGS. 5A through 5I, diodes D1, D2, through DN may be any diode, for example, but not limited to, a Schottky diode. In addition or as an alternative, diodes D1, D2 to DN in FIGS. 5A through 5I may be implemented using a transistor connected in a diode configuration, i.e., the gate of the transistor connected to the drain of the transistor. In addition or as an alternative, in FIGS. 5A through 5H, a component, such as, for example, but not limited to, a resistor as shown in FIG. 5I, may be coupled in series with diodes D1, D2 to DN.

In FIG. 5A, shut-off element 340 comprises a resistor R1 coupled with a gate-source-coupled transistor 370 (wherein gate-source-coupled transistor 370 has its gate coupled with its source) coupled in series between triggering element 330 and series element 350 to terminal 320. In one embodiment, gate-source-coupled transistor 370 is a depletion-mode FET. However, embodiments of the invention are not limited to gate-source-coupled transistor 370 being a depletion-mode FET. Series element 350 comprises a series resistor R2 coupled with the gate of transistor shunt element 360 and triggering element 330 and shut-off element 340.

Figure 5B:
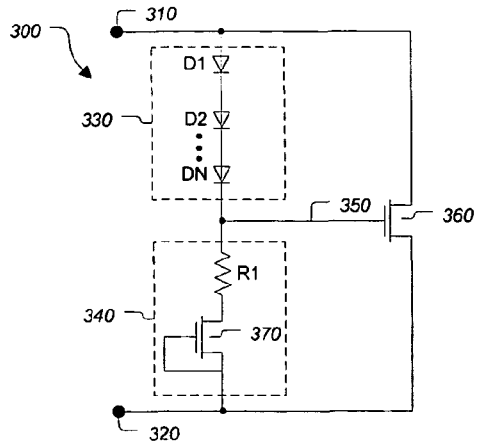

In FIG. 5B, triggering element 330 comprises a plurality of diodes D1, D2, through DN coupled in series from terminal 310 to shut-off element 340 and series element 350. Shut-off element 340 comprises a resistor R1 coupled with a gate-source-coupled transistor 370 coupled in series between triggering element 330 and series element 350 to terminal 320. Series element 350 comprises a short circuit that provides a direct connection between the gate of transistor shunt element 360 to triggering element 330 and shut-off element 340

Figure 5C:
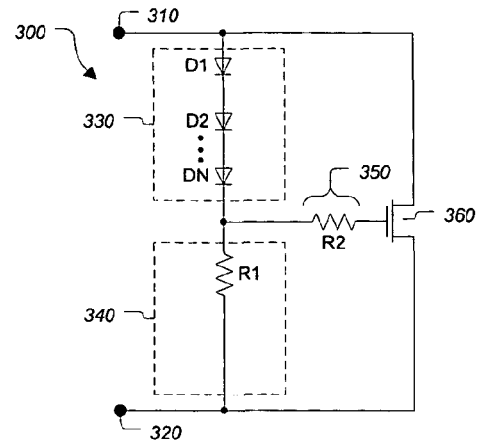

In FIG. 5C, triggering element 330 comprises a plurality of diodes D1, D2, through DN coupled in series from terminal 310 to shut-off element 340 and series element 350. Shut-off element 340 comprises a resistor R1 coupled in series between triggering element 330 and series element 350 to terminal 320. Shut-off element 340 may also comprise a gate-source-coupled transistor 370 coupled in series between triggering element 330 and series element 350 to terminal 320, as shown in FIG. 5H. Series element 350 comprises a series resistor R2 coupled with the gate of transistor shunt element 360 and triggering element 330 and shut-off element 340.

Figure 5D:
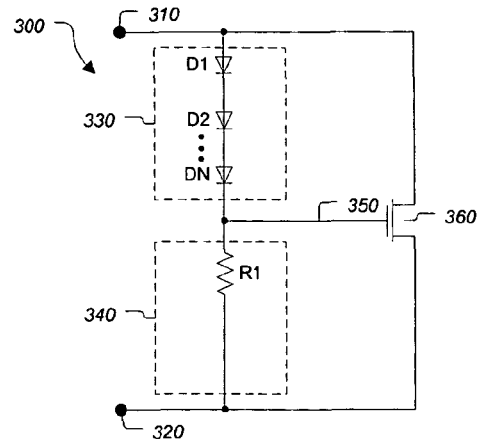

In FIG. 5D, triggering element 330 comprises a plurality of diodes D1, D2, through DN coupled in series from terminal 310 to shut-off element 340 and series element 350. Shut-off element 340 comprises a resistor R1 coupled in series between triggering element 330 and series element 350 to terminal 320. Series element 350 comprises a short circuit that provides a direct connection between the gate of transistor shunt element 360 to triggering element 330 and shut-off element 340.

Figure 5E:
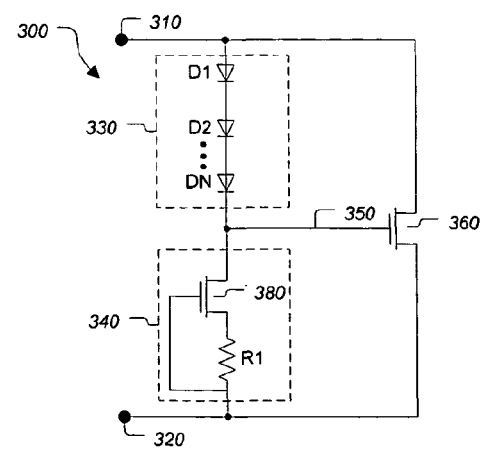

In FIG. 5E, triggering element 330 comprises a plurality of diodes D1, D2, through DN coupled in series from terminal 310 to shut-off element 340 and series element 350. Shut-off element 340 comprises a source-resistor-coupled transistor 380, wherein the source of source-resistor-coupled transistor 380 is coupled with a resistor R1 in series between triggering element 330 and series element 350 to terminal 320, and wherein the gate of source-resistor-coupled transistor 380 is coupled with terminal 320. In one embodiment, source-resistor-coupled transistor 380 is a depletion-mode FET. However, embodiments of the invention are not limited to source-resistor-coupled transistor 380 being a depletion-mode FET. Series element 350 comprises a short circuit that provides a direct connection between the gate of transistor shunt element 360 to triggering element 330 and shut-off element 340.

Figure 5F:
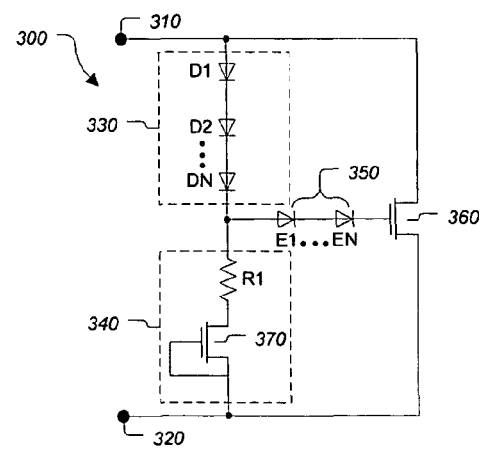

In FIG. 5F, triggering element 330 comprises a plurality of diodes D1, D2, through DN coupled in series from terminal 310 to shut-off element 340 and series element 350. Shut-off element 340 comprises a resistor R1 coupled with a gate-source-coupled transistor 370 coupled in series between triggering element 330 and series element 350 to terminal 320. Series element 350 comprises a plurality of diodes E1 through EN coupled in series from the gate of transistor shunt element 360 to triggering element 330 and shut-off element 340.

Figure 5G:
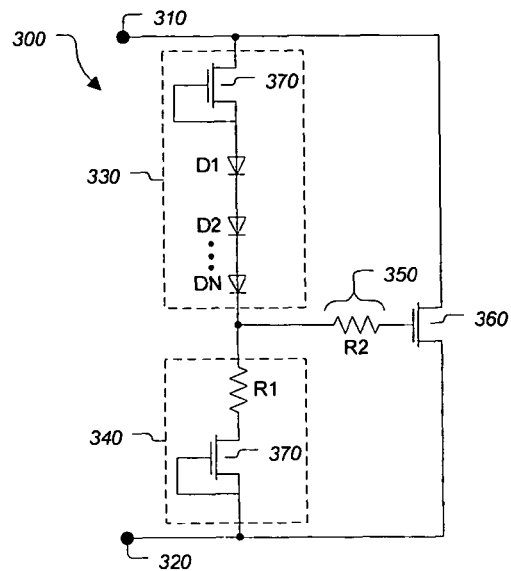
Figure 5H:
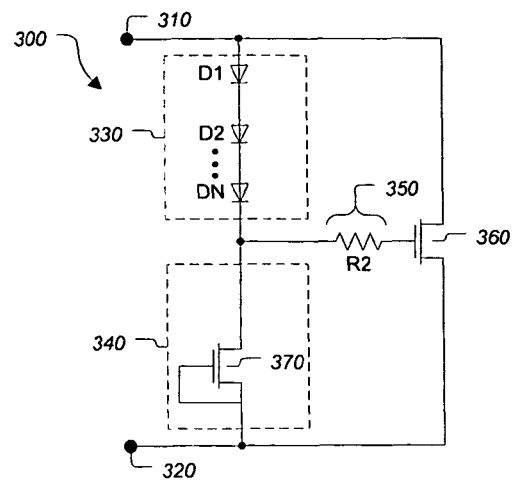
Figure 5I:
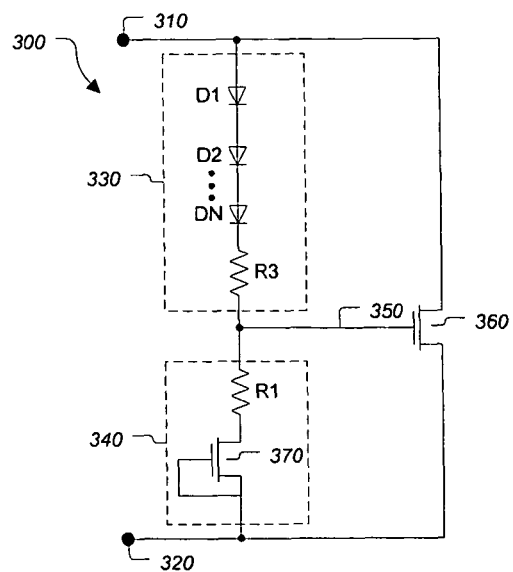

In FIG. 5G, triggering element 330 comprises a gate-source-coupled transistor 370 coupled with a plurality of diodes D1, D2, through DN coupled in series from terminal 310 to shut-off element 340 and series element 350. Shut-off element 340 comprises a resistor R1 coupled with a gate-source-coupled transistor 370 coupled in series between triggering element 330 and series element 350 to terminal 320. Series element 350 comprises a series resistor R2 coupled with the gate of transistor shunt element 360 and triggering element 330 and shut-off element 340.

In one embodiment of the present invention, the plurality of diodes D1, D2, through DN, of triggering element 330 provide for controlling or setting the turn-on voltage of transistor shunt element 360. For example, by increasing or decreasing the number of diodes (e.g. D1, D2, through DN) of triggering element 330, the turn-on voltage may be adjusted and controlled. As an example and not by way of limitation, the turn-on voltage may be increased by increasing the number of diodes coupled in series, or in the alternative, the turn-on voltage may be decreased by reducing the number of diodes coupled in series. Embodiments of the present invention contemplate the use of any type of diode, including, for example, but not limited to, a Schottky diode.

As described above, shut-off element 340 keeps the ESD discharge path, and in particular transistor shunt element 360, turned-off during normal operation (i.e., when the operating voltage is less than the turn-on voltage). However, during a negative ESD event, shut-off element 340 becomes the element that turns-on transistor shunt element 360, thereby providing bi-directional ESD discharge protection. In addition, as described above, series element 350 can be used to limit the gate current into transistor shunt element 360.

Although ESD protection circuit 300 is shown and described as having a particular arrangement of components, embodiments of the present invention contemplate any arrangement of components herein and/or any combination of components herein to perform ESD protection.

Figure 6:
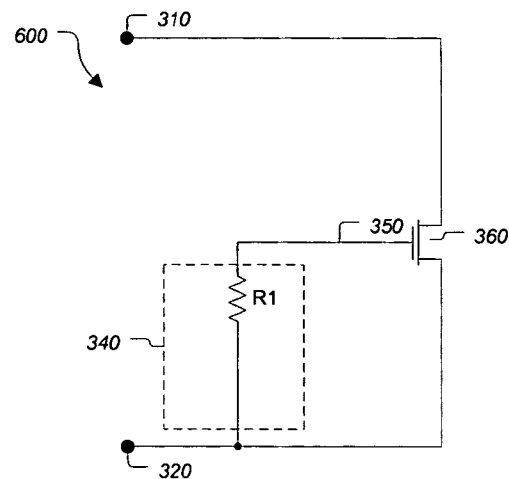
FIG. 6 illustrates an ESD protection circuit according to another embodiment of the present invention.

FIG. 6 illustrates ESD protection circuit 600 according to an embodiment of the present invention. In one embodiment, ESD protection circuit 600 comprises terminals 310 and 320, shut-off element 340, series element 350, and transistor shunt element 360. Shut-off element 340 comprises a resistor R1 in series between series element 350 and terminal 320. Series element 350 comprises a short circuit that provides a direct connection between the gate of transistor shunt element 360 and shut-off element 340.

In ESD protection circuit 600, the voltage at which transistor shunt element 360 dissipates an ESD event is determined by characteristics of transistor shunt element 360 and resistor R1 of shut-off element 340. Although shut-off element 340 and series element 350 are shown and described as comprising particular components, embodiments of the present invention contemplate any arrangement of components herein and/or any combination of components herein to perform ESD protection. For example, any shut-off element 340 and/or series element 350 described above in connection with FIGS. 5A-5I can be used with ESD protection circuit 600.

Figure 7:
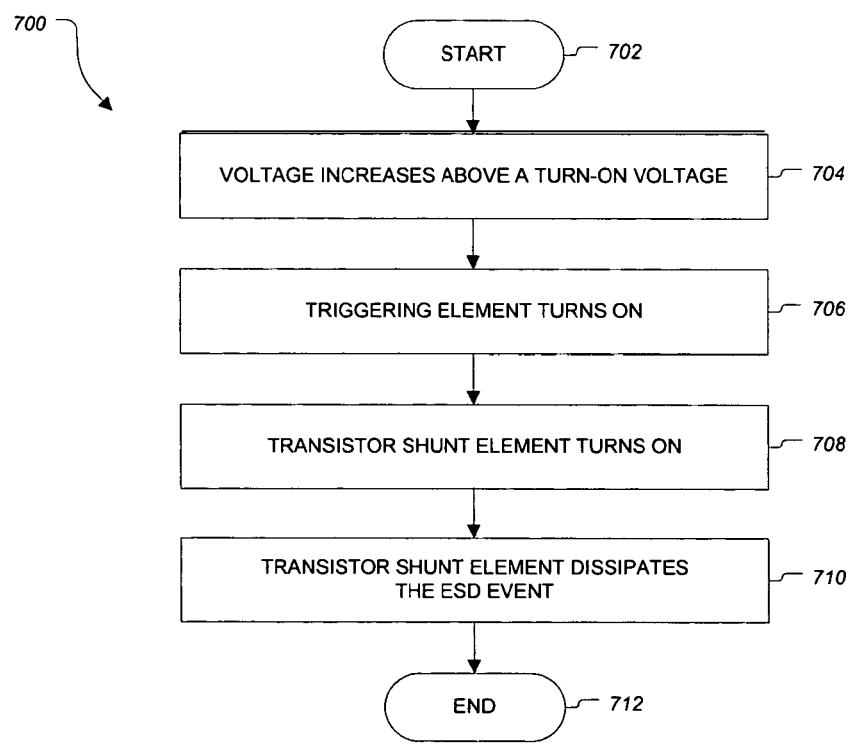
FIG. 7 illustrates a flow chart of a process for ESD protection for compound semiconductor devices and circuits according to embodiments of the present invention.

FIG. 7 illustrates a flow chart 700 of a process for ESD protection for compound semiconductor devices and circuits according to embodiments of the present invention. As described above, terminal 310 may be coupled with a device or an integrated circuit to be protected from an ESD event, and terminal 320 may be coupled with a ground or other reference potential other than ground. Accordingly, after ESD protection circuit 300 is operably coupled with a device or an integrated circuit to be protected, flow chart 700 starts at 702, with ESD protection circuit operating in normal operation (i.e., when the operating voltage is less than a turn-on voltage).

At 704, ESD protection circuit 300 experiences an ESD event and detects a voltage at, for example, terminal 310 above a turn-on voltage. As described above, by increasing or decreasing the number of diodes (e.g. D1, D2, through DN) of triggering element 330, the turn-on voltage may be adjusted and controlled. At 706, triggering element 330 turns-on and at 708, transistor shunt element 360 turns-on. The process continues at 710, where transistor shunt element 360 provides a minimal resistance discharge path to dissipate the ESD event, so that the ESD event does not damage the device or integrated circuit coupled with terminals 310 and 320.

The process ends at 712, once the voltage at terminal 310 is once again below the turn-on voltage. As described above, embodiments of the present invention operate in connection with either a positive or a negative ESD event. Therefore, although an ESD event has been described as occurring with respect to terminal 310, ESD protection circuit 300 provides for a bi-directional discharge path for either a positive or negative ESD event occurring at either terminal 310 or terminal 320.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of embodiments of the present invention. Accordingly, the invention is not limited to the embodiments disclosed, but rather by the appended claims and their equivalents.

What is claimed is:

1. An electrostatic discharge (ESD) protection circuit, comprising:
    a first terminal and a second terminal;
    a transistor shunt element operably coupled between the first terminal and the second terminal, the transistor shunt element to provide a discharge path between the first terminal and the second terminal for both a positive discharge event and a negative discharge event, wherein the transistor shunt element is an enhancement-mode compound semiconductor field effect transistor;
    a shut-off element operably coupled with the second terminal, the shut-off element capable of keeping the transistor shunt element turned-off; and
    a triggering element to provide a voltage to turn on the transistor shunt element, the triggering element including a plurality of diodes operably coupled in series between the first terminal and the shut-off element,
    wherein the ESD protection circuit is fabricated using a high electron mobility transistor (HEMT) technology.

2. The circuit of claim 1, further comprising a series element operably coupled between the transistor shunt element and the shut-off element, the series element capable of limiting current into a gate of the transistor shunt element.

3. The circuit of claim 2, wherein the shut-off element comprises a resistor operably coupled in series between the series element and the second terminal.

4. The circuit of claim 2, wherein the shut-off element comprises a gate-source-coupled transistor operably coupled in series between the second terminal and the series element.

5. The circuit of claim 2, wherein the shut-off element comprises a resistor operably coupled in series between a gate-source-coupled transistor and the series element, wherein the gate-source-coupled transistor is operably coupled in series with the second terminal, and wherein a gate of the gate-source-coupled transistor is coupled with a source of the gate-source-coupled transistor.

6. The circuit of claim 2, wherein the shut-off element comprises a source-resister-coupled transistor operably coupled in series between a resistor and the series element, wherein the resistor and a gate of the source-resistor-coupled transistor are operably coupled with the second terminal.

7. The circuit of claim 2, wherein the series element comprises a short circuit operably coupled in series between the transistor shunt element and the shut-off element.

8. The circuit of claim 2, wherein the series element comprises a resistor operably coupled in series between the transistor shunt element and the shut-off element.

9. The circuit of claim 2, wherein the series element comprises a plurality of diodes operably coupled in series between the transistor shunt element and the shut-off element.

10. The circuit of claim 1, wherein the triggering element further comprises a resistor operably coupled in series with the plurality of diodes.

11. The circuit of claim 1, wherein the triggering element further comprises gate-source-coupled transistor in series with the plurality of diodes, wherein a gate of the gate-source-coupled transistor is coupled with a source of the gate-source-coupled transistor.

12. The circuit of claim 1, wherein the shut-off element comprises a resistor operably coupled in series between the second terminal and the triggering element and the series element.

13. The circuit of claim 1, wherein the shut-off element comprises a gate-source-coupled transistor operably coupled in series between the second terminal and the triggering element and the series element.

14. The circuit of claim 1, wherein the shut-off element comprises a resistor operably coupled in series between a gate-source-coupled transistor and the triggering element and the series element, wherein the gate-source-coupled transistor is operably coupled in series with the second terminal, and wherein a gate of the gate-source-coupled transistor is coupled with a source of the gate-source-coupled transistor.

15. The circuit of claim 1, wherein the shut-off element comprises a source-resistor-coupled transistor operably coupled in series between a resistor and the triggering element and the series element, wherein the resistor and a gate of the source-resistor-coupled transistor are operably coupled with the second terminal.

16. The circuit of claim 1, wherein the series element comprises a short circuit operably coupled in series between the transistor shunt element and the triggering element and the shut-off element.

17. The circuit of claim 1, wherein the series element comprises a resistor operably coupled in series between the transistor shunt element and the triggering element and the shut-off element.

18. The circuit of claim 1, wherein the series element comprises a plurality of diodes operably coupled in series between the transistor shunt element and the triggering element and the shut-off element.

19. The circuit of claim 2, wherein the first terminal is operably coupled with an integrated circuit to be protected against an ESD event and the second terminal is operably coupled with a ground or a reference voltage.

20. The circuit of claim 2, wherein the ESD protection circuit is fabricated using Gallium Nitride.

21. The circuit of claim 2, wherein the compound semiconductor includes a material selected from the group consisting of:
  Aluminum Gallium Arsenide;
  Indium Gallium Arsenide;
  Indium Gallium Phosphide;
  Indium Aluminum Arsenide:
  Aluminum Gallium Nitride;
  Indium Gallium Nitride;
  Gallium Arsenide;
  Indium Phosphide;
  Gallium Nitride;
  Aluminum Arsenide;
  Gallium Arsenide Antimonide; and
  Indium Gallium Arsenide Nitride.

22. A semiconductor device for providing electrostatic discharge (ESD) protection to an integrated circuit, the device comprising:
  a first terminal and a second terminal, wherein the first terminal is capable of being operably coupled with the integrated circuit and the second terminal is capable of being operably coupled with a ground;
  a transistor shunt element operably coupled between the first terminal and the second terminal, the transistor shunt element to provide a discharge path to dissipate both a positive ESD event and a negative ESD event, wherein the transistor shunt element is an enhancement-mode compound semiconductor field effect transistor;
  a shut-off element operably coupled with the second terminal, the shut-off element capable of keeping the transistor shunt element turned-off; and
  a series element operably coupled between the transistor shunt element and the shut-off element, the series element capable of limiting current into a gate of the transistor shunt element; and
  a triggering element to provide a voltage to turn on the transistor shunt element, the triggering element including a plurality of diodes operably coupled in series between the first terminal and the shut-off element and the series element,
  wherein the triggering element includes a ESD protection circuit is fabricated using a high electron mobility transistor (HEMT) technology.

23. A method for providing electrostatic discharge (ESD) protection for an integrated circuit, the method comprising:
  detecting a voltage at a first terminal of an ESD protection circuit;
  turning-on a triggering element of the ESD protection circuit in response to the detection of the voltage;
  turning-on a transistor shunt element of the ESD protection circuit in response to the triggering element turning-on; and
  providing a discharge path between the first terminal to a second terminal via the transistor shunt element, to dissipate both a positive ESD event and a negative ESD event, wherein the transistor shunt element is an enhancement-mode compound semiconductor field effect transistor,
  wherein the triggering element includes a plurality of diodes operably coupled in series between the first terminal and the shut-off element and the series element and wherein the ESD protection circuit is fabricated using a high electron mobility transistor (HEMT) technology.

24. The method of claim 23, further comprising:
  keeping the transistor shunt element turned-off until the voltage is detected; and
  limiting current into a gate of the transistor shunt element.

* * * * *